United States Patent
Kohli et al.

(10) Patent No.: US 10,386,714 B2
(45) Date of Patent: Aug. 20, 2019

(54) CREATING KNOWLEDGE BASE FOR OPTICAL PROXIMITY CORRECTION TO REDUCE SUB-RESOLUTION ASSIST FEATURE PRINTING

(71) Applicant: GLOBALFOUNDRIES Inc., Grand Cayman (KY)

(72) Inventors: Kriteshwar K. Kohli, White Plains, NY (US); Mark N. Jobes, Hopewell Junction, NY (US); Ioana C. Graur, Poughkeepsie, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 424 days.

(21) Appl. No.: 15/401,299

(22) Filed: Jan. 9, 2017

(65) Prior Publication Data

US 2018/0196340 A1    Jul. 12, 2018

(51) Int. Cl.
*G06F 17/50* (2006.01)
*G03F 1/36* (2012.01)

(52) U.S. Cl.
CPC ...................... *G03F 1/36* (2013.01)

(58) Field of Classification Search
USPC .................... 716/51, 52, 53, 54, 55
See application file for complete search history.

(56) References Cited

U.S. PATENT DOCUMENTS

| | | | |
|---|---|---|---|
| 6,593,226 B2* | 7/2003 | Travis | H01L 21/31053 257/E21.244 |
| 8,504,949 B2 | 8/2013 | Robles et al. | |
| 8,881,069 B1* | 11/2014 | Hamouda | G03F 1/36 716/53 |
| 2006/0200790 A1* | 9/2006 | Shang | G03F 1/36 430/5 |
| 2011/0202892 A1* | 8/2011 | Lee | G03F 1/36 716/53 |
| 2014/0282290 A1* | 9/2014 | Rieger | G03F 1/36 716/51 |
| 2015/0213374 A1 | 7/2015 | Agarwal et al. | |
| 2015/0339802 A1* | 11/2015 | Isoyan | G03F 1/36 382/128 |

* cited by examiner

Primary Examiner — Brian Ngo
(74) Attorney, Agent, or Firm — Anthony Canale; Hoffman Warnick LLC

(57) ABSTRACT

Embodiments of the present disclosure include methods, program products, and systems for creating a knowledge base for optical proximity correction (OPC). Methods according to the disclosure can include: fabricating a circuit using a proposed IC layout; identifying a plurality of features in an image of the fabricated circuit; predicting, based on the identifying and a predictive algorithm, whether the fabricated circuit includes a printed sub-resolution assist feature (SRAF) from the proposed IC layout; determining the predicting as being correct when the fabricated circuit includes the printed SRAF, or as being incorrect when the fabricated circuit does not include the printed SRAF; in response to the predicting being incorrect: adjusting the predictive algorithm, and flagging the fabricated circuit as incorrectly predicted; in response to the predicting being correct, flagging the fabricated circuit as correctly predicted; and storing the image of the fabricated circuit in a repository of training data.

20 Claims, 6 Drawing Sheets

⊕ - Fabricated circuit
○ - Other circuits

⊕ - Fabricated circuit
○ - Other circuits

CREATING KNOWLEDGE BASE FOR OPTICAL PROXIMITY CORRECTION TO REDUCE SUB-RESOLUTION ASSIST FEATURE PRINTING

BACKGROUND

Technical Field

The present disclosure relates to integrated circuits (ICs). More specifically, the present disclosure relates to methods, program products, and systems for generating a knowledge base for Optical Proximity Correction (OPC) to reduce the printing of sub-resolution assist features (SRAFs).

Related Art

As integrated circuit (IC) components have continued to decrease in size, improvements to scale have spawned design implementation issues for some types of features, e.g., in complementary metal-oxide-semiconductor (CMOS) ICs with features sized less than approximately twenty-two nanometers (nm). As IC technology continues to shrink, the growing need for empirical data from a design may exacerbate the uncertainty of the manufacturing process, thereby increasing the risk of defects or impaired operability. Conventional approaches for traversing physical limits may apply manual or computer-implemented techniques for increasing the resolution of chips printed using optical lithography. One such technique is known as optical proximity correction (OPC). OPC is a computational method for correcting irregularities and distortions arising from diffraction effects by the transforming of mask geometries.

An OPC model of layout for an IC structure may include one or more sub-resolution assist features (SRAFs), also known as "scattering bars," solely to improve the printability of isolated features. SRAFs take advantage of the fact that an isolated feature in an OPC model will typically print at a feature size significantly different from similarly positioned features which are in close proximity with other features. An SRAF may be included in a mask near a relatively isolated target feature to affect the printing density of the feature, e.g., to cause the targeted feature to behave more like a dense feature after being printed, and/or to change the position of the projected edges in the targeted feature. SRAFs are structured such that their intensity profiles are not below a threshold dose for fabricating an IC structure, and thus are considered to be "sub-resolution" features. The presence of an SRAF near the targeted feature will affect nearby printed features, without the SRAF actually being printed. Thus, an IC structure printed using the model will ideally not include any SRAFs therein.

In practice, however, some models may yield printed IC structures with SRAFs included, and the presence of such SRAFs can interfere with the operation of a product. SRAFs may be inadvertently printed, e.g., by being close enough to a minimum printing size to affect the printability of nearby features, yet exceeding the minimum size for a feature to be printed during fabrication. The printing of SRAFs in a product may contribute to operating volatility and/or reductions in fabrication output. Present techniques for reducing the number of printed SRAFs in a product vary widely due to differences between individual products and sometimes inconsistent criteria for classifying a product as including printed SRAFs or being SRAF-free. Other techniques for reducing the presence of printed SRAFs may be associated with other challenges. For example, classifying images of an IC based on edge detection filters may not have an acceptable level of accuracy for some products or fields. Manual classification of images as including printed SRAFs or being SRAF-free is prone to human error and, in any case, requires a high amount of engineering hours to classify each IC product. Many conventional techniques also do not provide an acceptable prediction of whether an IC product is likely to include printed SRAFs. The most popular conventional techniques for predicting whether printed SRAFs will appear may rely solely upon attributes of the original IC design layout, and fabricating the circuit only at a later stage, after analyzing the layout.

SUMMARY

A first aspect of the present disclosure provides a method for creating a knowledge base for optical proximity correction (OPC), the method including: fabricating a circuit using a proposed IC layout; identifying a plurality of features in an image of the fabricated circuit; predicting, based on the identifying and a predictive algorithm, whether the fabricated circuit includes a printed sub-resolution assist feature (SRAF) from the proposed IC layout; determining the predicting as being correct when the fabricated circuit includes the printed SRAF, or as being incorrect when the fabricated circuit does not include the printed SRAF; in response to the predicting being incorrect: adjusting the predictive algorithm, and flagging the fabricated circuit as incorrectly predicted; in response to the predicting being correct, flagging the fabricated circuit as correctly predicted; and storing the image of the fabricated circuit in a repository of training data.

A second aspect of the present disclosure provides a program product stored on a computer readable storage medium, the program product operative to create a knowledge base for optical proximity correction (OPC) when executed, the computer readable storage medium comprising program code for: causing a fabricating device to fabricate a circuit using a proposed IC layout; identifying a plurality of features in an image of the fabricated circuit; predicting, based on the identifying and a predictive algorithm, whether the fabricated circuit includes a printed sub-resolution assist feature (SRAF) from the proposed IC layout; determining the predicting as being correct when the fabricated circuit includes the printed SRAF, or as being incorrect when the fabricated circuit does not include the printed SRAF; in response to the predicting being incorrect: adjusting the predictive algorithm, and flagging the printed circuit as incorrectly predicted; in response to the predicting being correct, flagging the fabricated circuit as correctly predicted; and storing the image of the fabricated circuit in a repository of training data.

A third aspect of the present disclosure provides a system for building a knowledge base for optical proximity correction (OPC), the system including: a fabricating device configured to fabricate a circuit using a proposed integrated circuit (IC) layout; and a layout analysis component configured to: identify a plurality of features in an image of a fabricated circuit yielded from the fabricating device; and predict, based on the identifying and a predictive algorithm, whether the fabricated circuit includes a printed sub-resolution assist feature (SRAF); a training component configured to: determine the prediction as being correct when the fabricated circuit includes the printed SRAF, or as being incorrect when the fabricated circuit does not include the printed SRAF; in response to the prediction being incorrect: adjust the predictive algorithm, and flag the fabricated circuit as incorrectly predicted, in response to the prediction being correct, flag the fabricated circuit as correctly predicted, and store the image of the fabricated circuit in a repository of training data.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

Figure 1:
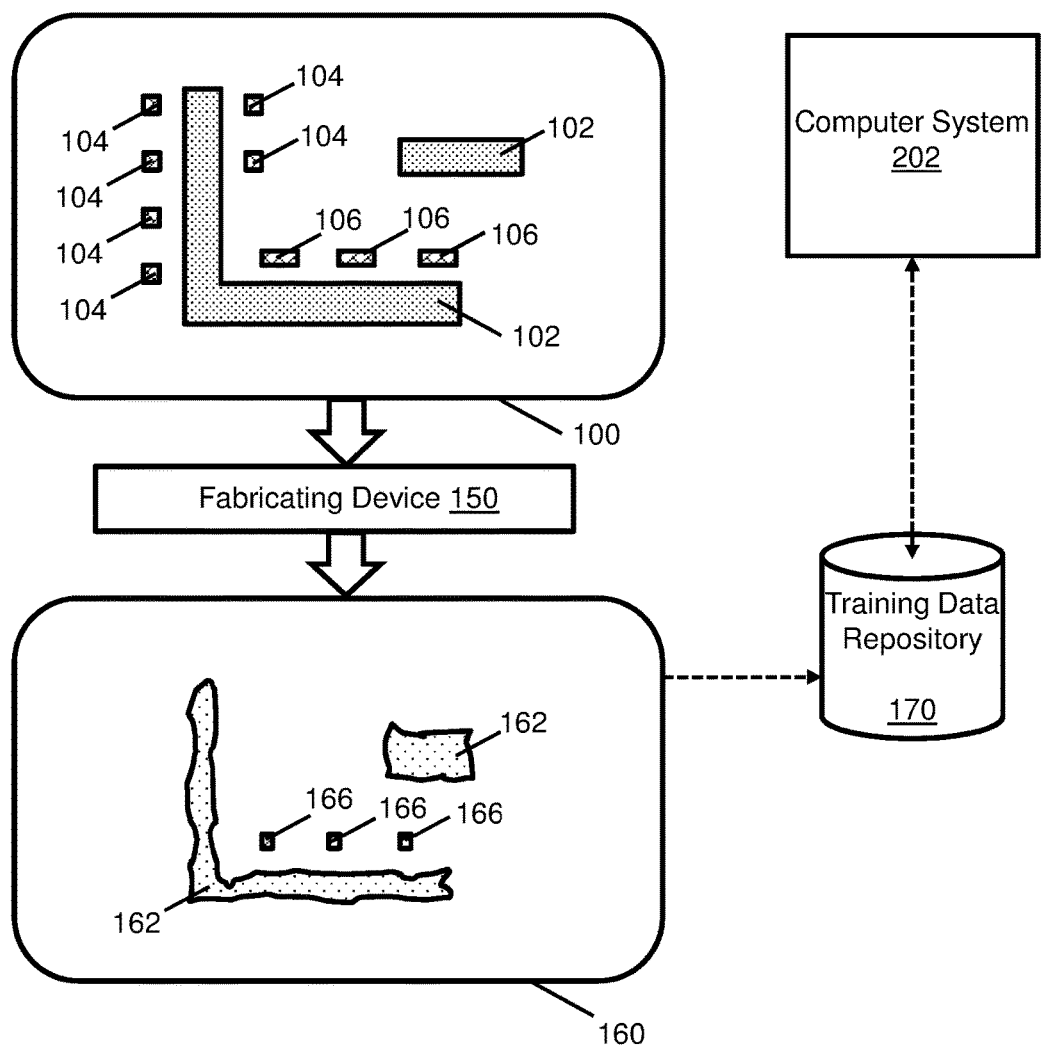
FIG. 1 provides a schematic view of a system according to embodiments of the disclosure.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Introduction and General Definitions

Embodiments of the present invention are directed toward techniques for creating a knowledge base for optical proximity correction (OPC) to predict, based on an image of a fabricated circuit, whether the fabricated circuit includes any printed sub-resolution assist features (SRAFs). The present disclosure includes using a predictive algorithm to predict whether an image of a fabricated integrated circuit (IC) includes printed SRAFs therein. The method also includes determining whether the fabricated circuit actually includes one or more printed SRAFs, and adjusting the predictive algorithm if the original prediction was incorrect. Creating a knowledge base according to the disclosure includes, e.g., fabricating a circuit using a proposed IC layout, and identifying a plurality of features in the fabricated circuit. The identified features can include printable features in a circuit and/or SRAFs which affect the printing of other features, but were not intended to print. Using the identified features and a predictive algorithm, embodiments of the disclosure can include predicting whether the fabricated circuit includes one or more printed SRAFs after being fabricated, without the aid of additional information concerning the printed circuit (e.g., measurements, the original IC layout, etc.). The method can include determining, after the prediction, whether the fabricated circuit includes any printed SRAFs. In the event that the fabricated circuit includes a printed SRAF (determined, e.g., by reviewing a scanning electron microscope (SEM) image of the circuit and applying one or more external analysis techniques), the method can include adjusting the predictive algorithm to account for the printed SRAFs and flagging the fabricated circuit as being incorrectly predicted. The fabricated circuit can be flagged as correctly predicted in response to the prediction being correct, without an accompanying adjustment to the predictive algorithm. To aid future predictions, the method can include storing the image of the fabricated circuit in a repository of training data, which may be accessible during fabrication of other components and/or products.

To better illustrate the various embodiments of the present disclosure, particular terminology which may be known or unknown to those of ordinary skill in the art is defined to further clarify the embodiments set forth herein. The term "system" can refer to a computer system, server, etc., composed wholly or partially of hardware and/or software components, one or more instances of a system embodied in software and accessible a local or remote user, all or part of one or more systems in a cloud computing environment, one or more physical and/or virtual machines accessed via the internet, other types of physical or virtual computing devices, and/or components thereof.

The term "IC layout" can refer to a complete or partial IC chip which includes a plurality of circuit features (simply "features" hereafter). An "IC layout" or "design layout" refers to a virtual representation of an IC layout or portion thereof, which may be stored, e.g., in a memory component of a computer system. A "region" refers to any subset of a given design layout. A "pattern" or "feature pattern" refers to a design layout representation of one or more features in an IC layout, which may be transferred from the memory of a computer system onto a mask by way of direct-write electron beam lithography. Optical proximity correction (or "OPC") generally refers to a process by which an IC layout is modeled for printing by converting a set of ideal feature patterns into corrected feature shapes to account for one or more printing errors.

A "shape" or "feature shape" refers to an estimated printing region of a given pattern in an OPC model, which may account for printing errors or related constraints. A "feature" generally refers to a functional element in an IC layout (e.g., a wire) which must be printed on a wafer using photolithography techniques. A sub-resolution assist feature (SRAF), also known as a "scattering bar," refers to a feature included in an IC layout solely to improve the printability of isolated features. SRAFs take advantage of the fact that an isolated feature in an OPC model will typically print at a feature size significantly different from similarly positioned features which are in close proximity with other features, e.g., to increase the size or adjust the edges of other features.

Example of Knowledge Base-Aided Circuit Fabrication

FIG. 1 provides schematic view of a process for fabricating integrated circuit (IC) products according to the disclosure. In particular, embodiments of the disclosure provide for knowledge base-aided circuit fabrication and a machine learning technique for reducing the printing of sub-resolution assist features (SRAFs) in a fabricated circuit. FIG. 1 illustrates a proposed IC layout indicative of at least a portion of a product to be modeled and manufactured using optical proximity correction (OPC). Proposed IC layout 100 can include features 102 to be printed at various positions. Two features 102 are shown in proposed IC layout 100 for the purposes of demonstration only, and it is understood that proposed IC layout 100 of FIG. 1 can represent only a portion of a larger IC layout to be printed. More specifically, IC layout 100 depicted in FIG. 1 can represent a single region of proposed IC layout 100. Each region of IC layout 100 may include features 102 which are in close physical proximity relative to other patterns, and/or may be functionally interrelated or designed to be manufactured together. In some cases, proposed IC layout 100 may include only a select group of regions and associated features 102, which may provide a group of empirical data for OPC.

As shown, proposed IC layout 100 can include a first set of SRAFs 104 and a second set of SRAFs 106. As described elsewhere herein, SRAFs 104, 106 are included in proposed IC layout 100 nearby features 102 to affect the printing thereof, e.g., by increasing the thickness, length, etc., due to proximity effects of various fabrication devices used to yield an IC product. One group of SRAFs 104 may be of a size which prevents them from being physically generated upon fabrication of a product. SRAFs 104 may work as intended during fabrication of a device, e.g., by affecting the printability of features 102, but not actually being printed during manufacture. Another group of SRAFs 106, however, may unexpectedly be within the printing resolution of a fabricating instrument which uses proposed IC layout 100 to form a manufactured product.

A fabricating device 150 (e.g., a single fabricating plant and/or a group of interconnected devices for producing a device from a proposed layout) can be operable to receive proposed IC layout 100 and yield a fabricated circuit 160 based on proposed IC layout 100. Fabricated circuit 160 can include one or more printed features 162 formed based on, e.g., feature(s) 102 of proposed IC layout 100. Fabricating device 150 can be operable to, e.g., cause manufacture of one or more circuit elements at positions designated with features 102 in proposed IC layout 100. As discussed elsewhere herein, the position of SRAFs 104, 106 in proposed IC layout 100 can affect the size, shape, etc., of printed features 162 in fabricated circuit 160.

As discussed elsewhere herein, fabricating device 150 may cause some SRAFs 106 in proposed IC layout 100 to unexpectedly appear in fabricated circuit 160 as printed SRAFs 166. As discussed herein, printed SRAFs 166 may negatively affect fabrication of other components/and or the operation of fabricated circuit 160. Due to the size, position, and number of SRAFs 104, 106 in proposed IC layout 100, it may be difficult or impossible to predict, by conventional techniques, whether fabricated circuit 160 includes printed SRAFs 166 after being fabricated. Embodiments of the disclosure can include a training data repository 170 for building a knowledge base of fabricated circuits 160 which may include printed SRAFs 166 or may be free of printed SRAFs 166. In addition, training data repository 170 can include, e.g., images of fabricated circuits 160 for a plurality of different products, whether related or unrelated to fabricated circuit(s) 160 being analyzed in a given implementation. According to a further example, training data repository 170 can include a group of images of fabricated circuits 160 provided as samples, one or more of which are known to include an SRAF-free layout while other fabricated circuits 160 are known to include one or more SRAFs. Embodiments of the disclosure can also include a computer system 202 in communication with training data repository 170, e.g., according to any currently-known or later developed solution for communicating between data repositories (e.g., training data repository 170) and/or computer systems (e.g., computer system 202).

Computer system 202 can include and execute a predictive algorithm for predicting whether fabricated circuit 160 includes printed SRAF(s) 166, using only images of fabricated circuit 160 or other fabricated circuits 160 without additional reference data. In the event of an incorrect prediction, computer system 202 can store an image of fabricated circuit 160 in training data repository 170, and can flag the prediction for fabricated circuit 160 as being incorrect. In addition, computer system 202 can adjust the predictive algorithm for predicting, based on input images, whether fabricated circuit 160 includes printed SRAFs 166 therein. In the event of a correct prediction, computer system 202 can store an image of fabricated circuit 160 in training data repository 170 and flag the corresponding prediction as being correct. In this manner, computer system 202 can build a knowledge base (e.g., through training data repository) for continuously improving one or more predictive algorithms applied to each fabricated circuit 160.

Computer System and Example Components

Figure 2:
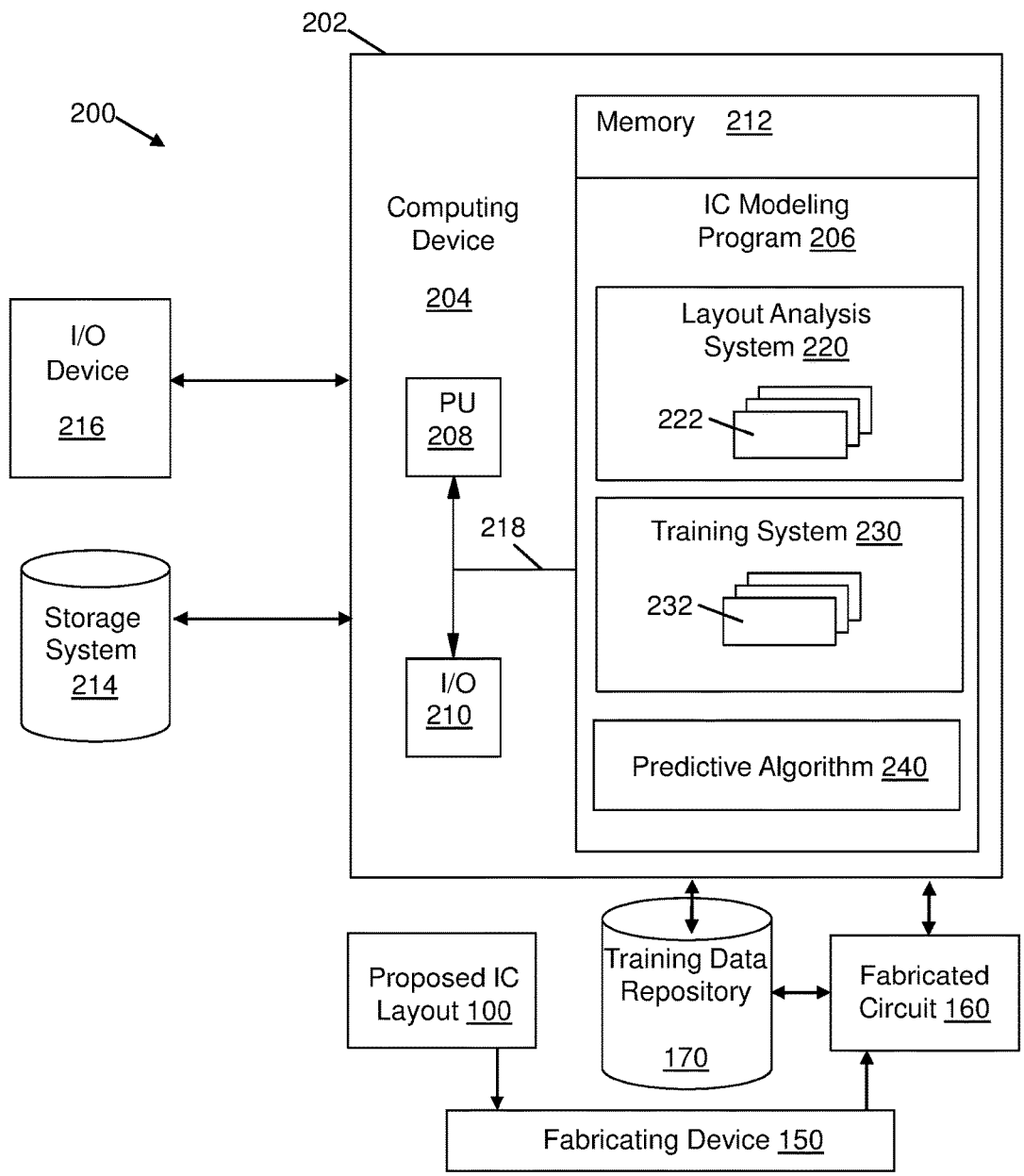
FIG. 2 depicts an illustrative environment which includes a computer system interacting with a fabricating device and training data repository according to embodiments of the disclosure.

Turning now to FIG. 2, an illustrative environment 200 for implementing the methods and/or systems described herein is shown. In particular, a computer system 202 is shown as including a computing device 204. Computing device 204 can include, e.g., an IC modeling program 206 which adjusts builds a knowledge base for reducing the fabrication of SRAFs by performing any/all of the processes described herein and implementing any/all of the embodiments described herein.

Computer system 202 is shown including a processing unit (PU) 208 (e.g., one or more processors), an I/O component 210, a memory 212 (e.g., a storage hierarchy), an external storage system 214, an input/output (I/O) device 216 (e.g., one or more I/O interfaces and/or devices), and a communications pathway 218. In general, processing unit 208 can execute program code, such as IC modeling program 206, which is at least partially fixed in memory 212. While executing program code, processing unit 208 can process data, which can result in reading and/or writing data from/to memory 212 and/or I/O device 216. Pathway 218 provides a communications link between each of the components in environment 200. I/O component 210 can comprise one or more human I/O devices, which enable a human user to interact with computer system 202 and/or one or more communications devices to enable a system user to communicate with the computer system 202 using any type of communications link. To this extent, IC modeling program 206 can manage a set of interfaces (e.g., graphical user interface(s), application program interface(s), etc.) that enable system users to interact with IC modeling program 206. Further, IC modeling program 206 can manage (e.g., store, retrieve, create, manipulate, organize, present, etc.) data, through several modules contained within a layout analysis system 220 (i.e., modules 222) and/or a training system 230 (i.e., modules 232). Layout analysis system 220 and training system 230 are shown by example as being sub-systems of IC modeling program 206. However, it is understood that layout analysis system 220 and training system 230 may be wholly independent systems and/or included together as a single system.

As noted herein, IC modeling program 206 can include layout analysis system 220 and training system 230. In this case, various modules 222 of layout analysis system 220 and modules 232 of training system 230 can enable computer system 202 to perform a set of tasks used by IC modeling program 206, and can be separately developed and/or implemented apart from other portions of IC modeling program 206. Memory 212 can thus include various software modules 222, 232 of systems 220, 230 configured to perform different actions. Example modules can include, e.g., a comparator, a calculator, a determinator, etc. One or more modules 222, 232 can use algorithm-based calculations, look up tables, software code, and/or similar tools stored in memory 212 for processing, analyzing, and operating on data to perform their respective functions. Each module discussed herein can obtain and/or operate on data from exterior components, units, systems, etc., or from memory 212 of computing device 204.

Specific modules 222, 232 of layout analysis system 220 and training system 230 are shown to illustrate operation of computer system 202 according to an example. Layout analysis system 220 can include, e.g., modules 222 for identifying features in one or more fabricated circuits 160. During operation, layout analysis system 220 can generate a database expressed, e.g., through a list, graphical representation, and/or other organizational structure of each feature identified in images of fabricated circuit 160. Layout analysis system 220 can be operable to identify functional features, SRAFs, and/or other printable components in fabricated circuit 160. In addition, layout analysis system 220 can quantify one or more metrics for each identified feature (e.g., length, width, surface area, etc.). In further embodiments, layout analysis system 220 can produce such outputs based on a scanning electron microscope (SEM) image of fabricated circuit 160 designed, e.g., with proposed IC layout 100. SEM images and/or other representations of fabricated circuit 160 may be provided, e.g., through 110 device 216. Some attributes of proposed IC layout 100 can be converted into a data representation (e.g., a data matrix with several values corresponding to particular attributes) and stored electronically, e.g., within memory 212 of computing device 204, storage system 214, and/or any other type of data cache in communication with computing device 204. Images and/or other representations of fabricated circuit 160 can additionally or alternatively be converted into data inputs or other inputs to IC modeling program 206 with various scanning or extracting devices and/or manual entry of a user, e.g., by determining the dimensions of features 102 (FIG. 1), SRAFs 104, 106 (FIG. 1), measuring and/or determining topology measures (e.g., a polygon count, area density, and/or diffraction order coefficient), calculating a value of a printability metric based on the attributes of each feature in fabricated circuit 160, etc.

A predictive algorithm 240 of IC modeling program 206 can define a relationship between the identified features of fabricated circuit 160 and a likelihood of whether fabricated circuit 160 one or more SRAFs, based solely on representative images for fabricated circuit 160. Predictive algorithm 240 can include, e.g., one or more adjustable calculations, logical determinations, etc., through any currently-known or later developed analytical technique for predicting an outcome based on raw data. Predictive algorithm 240 can use identified features fabricated circuit 160 as an input to predict whether fabricated circuit 160 includes printed SRAFs 166, without supplementary data relating to, e.g., proposed IC layout(s) 100. In further embodiments, predictive algorithm 240 can use training data repository 170 (e.g., data and images pertaining to other fabricated circuits 160 therein) to predict whether another fabricated circuit 160 includes printed SRAFs 166. Example processes executed with predictive algorithm 240 are discussed in detail elsewhere herein. Modules 222 of layout analysis system 220 and modules 232 of training system 230 can implement one or more mathematical calculations, e.g., to execute steps defined by predictive algorithm 240.

As discussed, training system 230 can include a corresponding set of modules 232 for executing functions of IC modeling program 206, discussed herein. Modules 232 of training system 230 can include, e.g., a determinator for making logical determinations based on one or more inputs. Modules 232 of training system 230 can thus evaluate whether predictions by predictive algorithm 240 are correct. More specifically, training system 230 can indicate whether predictive algorithm 240 correctly predicts whether one or more fabricated circuits 160 include SRAFs when produced by fabricating device 150. Training system 230 can include modules 232 for "flagging" (e.g., marking, indexing, and/or otherwise identifying in data) fabricated circuits 160 based on whether predictive algorithm 240 correctly predicted the appearance or non-appearance of SRAFs in fabricated circuit 160. Modules 232 of training system 230, in addition, can modify predictive algorithm 240 by adjusting variables, coefficients, threshold values, reference values, etc., of predictive algorithm 240 in response to the presence or absence of SRAFs in fabricated circuit 160 not being correctly predicted. Modules 232 of training system 230 can also include a calculator for carrying out various mathematical operations, e.g., to adjust predictive algorithm as prescribed by other processes. In other embodiments, modules 232 of layout analysis system 220 may be used to adjust predictive algorithm 240.

Computer system 202 can be operatively connected to or otherwise in communication with an OPC modeling device (e.g., an OPC modelor) for converting proposed IC layouts 100 into instructions used by fabricating device 150 to create fabricated circuit(s) 160. Computer system 202 can thus be embodied as a unitary device in a semiconductor manufacturing plant coupled to, e.g., an OPC modelor, fabricating device 150, and/or other devices, or can be multiple devices each operatively connected together to form computer system 202. Embodiments of the present disclosure can thereby include predicting (e.g., with predictive algorithm 240) whether fabricated circuits 160 include SRAFs without supplementary data pertaining to IC layout 100, determining whether the prediction was correct, and using an image of fabricated circuit 160 and the prediction results to adjust predictive algorithm 240. As discussed herein, embodiments of the present disclosure thereby provide machine learning processes for building a knowledge base for producing fabricated circuits 160 with a reduced risk of SRAF fabrication.

Where computer system 202 comprises multiple computing devices, each computing device may have only a portion of IC modeling program 206, layout analysis system 220, and/or training system 230 fixed thereon (e.g., one or more modules 222, 232). However, it is understood that computer system 202 and layout analysis system 220 are only representative of various possible equivalent computer systems that may perform a process described herein. Computer system 202 can obtain or provide data, such as data stored in memory 212 or storage system 214, using any solution. For example, computer system 202 can generate and/or be used to generate data from one or more data stores, receive data from another system, send data to another system, etc.

Operational Methodology

Figure 3:
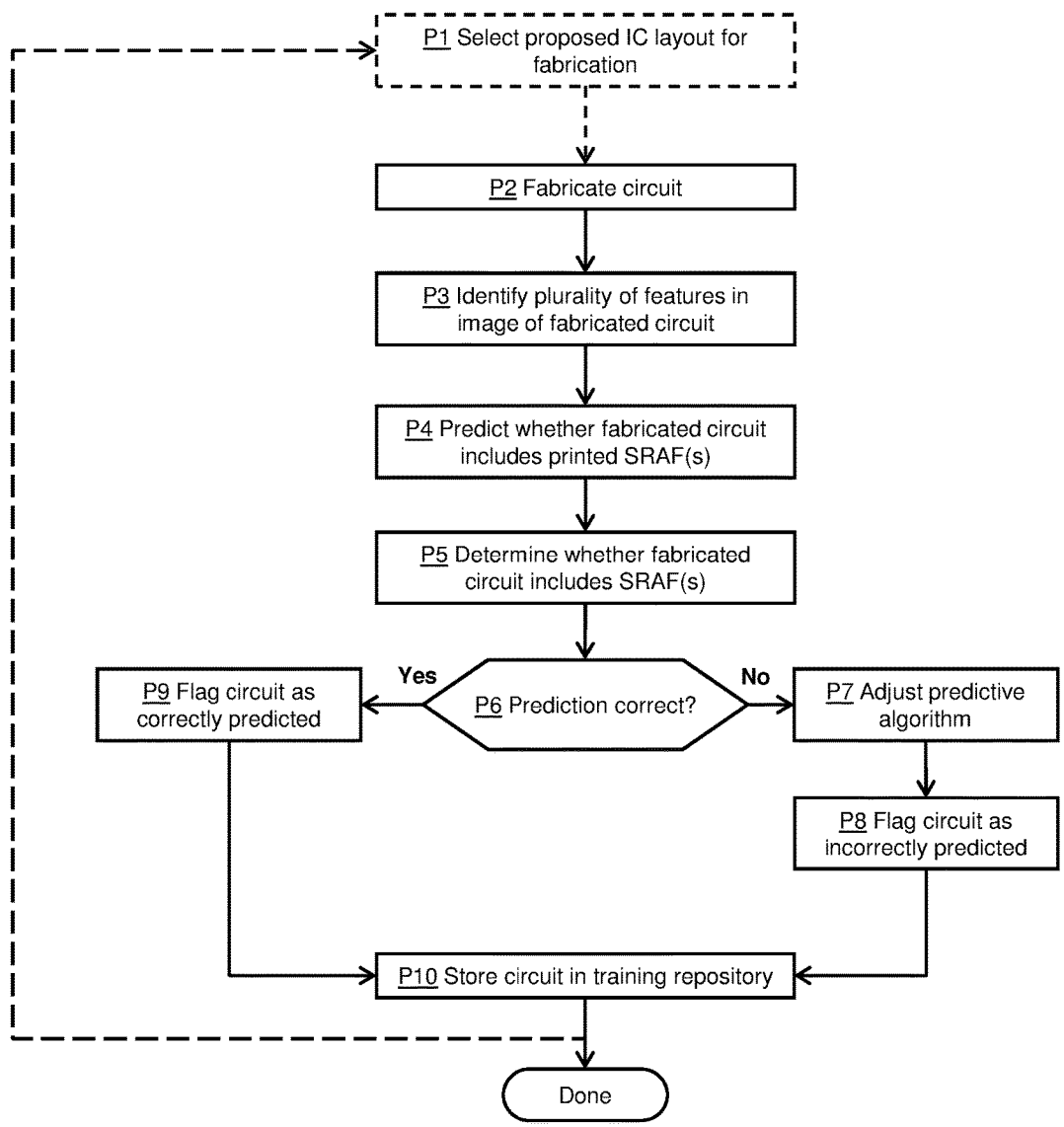
FIG. 3 depicts a flow diagram with illustrative process steps according to embodiments of the disclosure.

Referring to FIGS. 1-3 together, an illustrative flow diagram of processes according to the present disclosure is shown. The process flow diagram of FIG. 3 provides an overview of various method steps and processes. The steps and processes can each be carried out with one or more modules 222 of layout analysis system 220, modules 232 of training system 230, and/or other components of computer system 202 described herein by example. A single and/or repeated execution of the processes discussed herein can yield a machine learning process for repeatedly adding new proposed predictions and fabricated circuits 160 to training data repository 170 to improve future predictions. In this manner, circuit designers may adjust future proposed IC layouts 100 to predict and/or reduce the appearance of printed SRAFs 166 during manufacture.

Embodiments of the present disclosure, as illustrated by example in FIG. 3, can build a knowledge base for OPC as discussed herein. Using the various process steps discussed herein, IC modeling program 206 can repeatedly predict, without supplemental data pertaining to IC layout 100, whether fabricated circuits 160 include printed SRAFs 166 therein, add fabricated circuit(s) 160 to training data repository 170, and adjust predictive algorithm 240 to account for incorrect predictions. In the example processes discussed herein, fabricated circuit 160 will generally be described as including at least two features 162 therein, with some alternative examples referring to proposed IC layouts with different numbers of features (e.g., four features, ten features, etc.) and/or printed SRAFs 166. It is also understood that the present disclosure can be implemented with respect to multiple fabricated circuits 160 simultaneously and/or sequentially, with each fabricated circuit 160 including features 162 and/or SRAFs 166 with any conceivable dimensions, in any conceivable number, etc., and that other examples are discussed herein where appropriate. The various processes discussed herein, furthermore, can be implemented before, after, or during OPC implementation on one or more fabricated circuits 166.

In process P1, IC modeling program 206 or a user thereof can select one or more proposed IC layouts 100 for producing a circuit to be tested as described herein. Process P1 may be executed independently from further processes discussed herein, and thus is depicted with phantom lines in FIG. 3. Each proposed IC layout 100 can include, e.g., features 102 and/or SRAFs 104, 106. Although features 102 and SRAFs 104, 106 are identified separately for clarity of explanation, IC modeling program 206 may indiscriminately consider features 102 and SRAFs 104, 106 to simply be "features" in proposed IC layout 100. Methods according to the disclosure can build and/or expand a knowledge base for predicting whether any SRAFs 104, 106 in proposed IC layout 100 will appeared as printed SRAFs 166 in fabricated circuit 160, solely based on data pertaining to fabricated circuit 160 instead of IC layout 100. Proposed IC layout(s) 100 can be submitted to computer system 202, e.g., by being input to I/O device 216 through a computer-readable storage medium and/or other computer-readable input to computer system 202.

After a circuit is selected for fabrication in process P1, the method can then proceed to process P2 of producing fabricated circuit 160 with fabricating device 150 and proposed IC layout 100, e.g., according to any currently-known or later developed process for fabricating a circuit with a modeled layout. In process P3, modules 222 of layout analysis system 220 can identify a plurality of features included fabricated circuit 160, e.g., printed features 162 and/or printed SRAFs 166. To identify printed features 162 and/or printed SRAFs 166, modules 222 can analyze one or more images (e.g., SEM images) of fabricated circuit 160 to determine the size, shape, position, printability, etc., of printed structures such as printed features 162 and/or printed SRAFs 166 without reference to proposed IC layout 100. During the identifying in process P3, modules 222 may not yet distinguish between which of the identified structures are likely to be printed features 162 and/or printed SRAFs 166.

At process P4, IC modeling program 206 can execute predictive algorithm 240 to predict, based on images of fabricated circuit 160 instead of proposed IC layout 100, whether fabricated circuit 160 includes one or more printed SRAFs 166 after having being fabricated by fabrication device 150. As discussed elsewhere herein, predictive algorithm 240 can include one or more predictive analytical techniques, e.g., a K-nearest neighbor analysis, a support vector machine analysis, and/or a principal component analysis of fabricated circuit 160. In addition, further and/or conventional predictive analytical techniques (e.g., relative sizes of printed features 162, printed SRAFs 166, differences in the number of similar or identical printed features 162 and/or printed SRAFs 166, etc.) can be used to predict whether fabricated circuit 160 includes printed SRAFs 166 after having been fabricated with fabrication device 150. Although specific examples of predictive techniques are discussed herein, it is understood that any number of predictive techniques may be used to predict whether fabricated circuit 160 includes printed SRAF(s) 166 therein based solely on corresponding image data. Examples of such techniques can include, e.g., artificial neural networks, K-means clustering, logistic regressions, and/or other currently-known or later developed statistical analysis and/or machine learning techniques. Such techniques, in addition, may operate using one or more images of fabricated circuit 160 and/or fabricated circuits in training data repository 170. Process P4 can yield a prediction by layout analysis system 220 for fabricated circuit(s) 160, e.g., as including printed SRAFs 166, or being free of printed SRAFs 166.

After predicting whether fabricated circuit 160 includes one or more printed SRAFs 166, embodiments of the disclosure can proceed to further steps for using the prediction and characteristics of fabricated circuit 160 to build a knowledge base for use with further other circuits. According to an example, training system 230 and/or users thereof can further analyze fabricated circuit 160 on which any printed SRAFs 166 can be visually identified. Using reference data, internal logic, algorithms, and/or other techniques for identifying printed SRAFs 166 in fabricated circuit 160, a determinator of modules 232, and/or a user of training system 230, can determine whether fabricated circuit 160 includes one or more printed SRAFs 166 in process P5.

Upon determining whether fabricated circuit 160 includes printed SRAFs 166, a comparator of modules 232 of training system 230 can compare the prediction from process P4 with the determination in process P5 and analyze the accuracy of predictive algorithm 240 relative to fabricated circuit 160. In process P6, training system 230 can determine whether the prediction from predictive algorithm 240 was correct as to whether fabricated circuit 160 includes printed SRAFs 166. In the event of an incorrect prediction by predictive algorithm 240 (i.e., "No" at process P6), the flow can proceed to process P7 in which module(s) 222, 232 of layout analysis system 220 and/or training system 230 adjust predictive algorithm 240 for other fabricated circuits 160. For example, predictive algorithm 240 may include threshold values for patterns of printed features 162 and/or printed SRAFs 166 in which a surface area being above a first predetermined amount, a length dimension being above a predetermined amount, printed features 162 being less than a threshold distance away from adjacent printed features 162 and/or printed SRAFs 166, and/or other attributes suggesting that one or more identified features are actually printed SRAF(s) 166. According to further examples, predictive algorithm may apply pixel intensity values in image(s) of fabricated circuit 160 to predict whether any of the features identified in fabricated circuit 160 constitute one or more SRAFs. Regardless of the criteria used for prediction, it is possible to use characteristics of an image for fabricated circuit 160 which have no physical meaning and/or ambiguous physical relevance (e.g., pixel intensity and/or similar measures) to predict whether fabricated circuit 160 includes printed SRAF(s) 166 therein. During process P7, layout analysis system 220 and/or training system 230 can increase and/or decrease one or more of these values to reflect similar attributes of printed SRAF(s) 166 in fabricated circuit 160. More specific examples of predictive algorithms 240 to be adjusted in process P7, and associated forms of adjustment, are further discussed elsewhere herein. The flow can then proceed to process P8, in modules 232 of training system 230 flag fabricated circuit 160 as being incorrectly predicted. In the event that the prediction by predictive algorithm 240 is correct (i.e., "yes" at process P6), the flow can proceed to process P9 where modules 232 of training system 230 can flag fabricated circuit 160 as being correctly predicted.

Regardless of whether the prediction by predictive algorithm 240 is correct, the flow can proceed from process P8 or process P9 to process P10, in which modules 232 of training system 230 store fabricate circuit 160 and/or an image representations of fabricated circuit 160 in training data repository 170 to provide a knowledge base for future predictions. IC modeling program 206 can store proposed IC the corresponding prediction by predictive analysis 240 and/or representations of fabricated circuit 160 to training data repository 170 as indexed data to be used in future application of the processes discussed herein. Thereafter, the method can conclude ("Done") or repeat in a looping fashion (e.g., return to process P1 along the corresponding phantom line) for other circuits to be fabricated. Further embodiments of the disclosure can include a variety of paradigms and/or tools in predictive algorithm 240, and several examples are discussed herein. It is understood that the example techniques for predictive algorithm 240 may be implemented together and/or separately.

First Example: Prediction Using Principal Component Analysis

Figure 4:
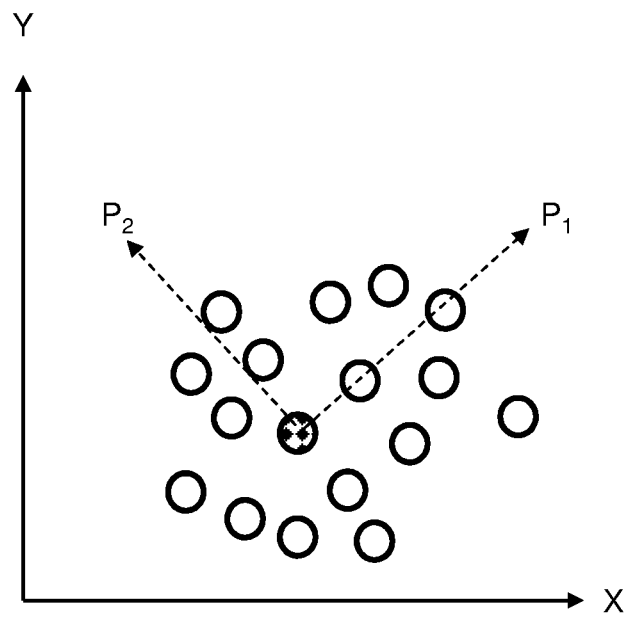
FIG. 4 depicts a principal component analysis for a fabricated circuit relative to other circuits according to embodiments of the disclosure.
Figure 4:
Figure 4:
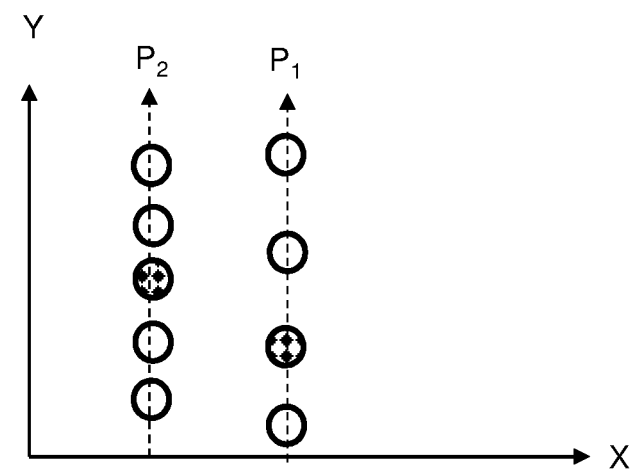

Referring to FIGS. 2-4 together, predictive algorithm 240 can implement a principal component analysis ("PCA") analysis to predict whether fabricated circuit 160 includes printed SRAFs 166 therein based solely on image features. PCA generally refers to a statistical analysis technique in which sets of possibly correlated data (e.g., various attributes of one or more fabricated circuits 160) into sets of representative, linearly uncorrelated variables. Such variables fabricated circuit(s) 160 can be depicted in two or more dimensions on associated axes, e.g., X axis and Y axis. Such variables may include, e.g., a measure of surface area of features in fabricated circuit 160 (e.g., greatest surface area, pixel density, discontinuity sizes, smallest surface area, average surface area, mode surface area, etc.), or similar measure for other properties fabricated circuit 160 (e.g., other representative values for length dimension, width, separation distance between features, etc.). In the example of FIG. 4, total surface area of each identified feature (indiscriminately including printed features 162 (FIG. 1) and/or printed SRAFs 166 (FIG. 1)) may be plotted on X axis while average separation distance between identified feature(s) can be plotted on Y axis. The variables produced in PCA can be organized along defined orthogonal reference lines $P_1$, $P_2$, also known as "components." Whichever variables are selected, each representative quantity for fabricated circuit 160 may be plotted on one axis, e.g., X axis, Y axis, etc., while others may be plotted on other respective axes. As shown, the components can then be ordered (e.g., along X axis) by the amount of statistical variance therebetween, and plotted against all other components relative to other quantified components for the set (plotted, e.g., along Y axis). In the example of FIG. 4, component $P_2$ is shown to have lower statistical variance than component $P_1$, and each component is plotted against average separation distance (i.e., Y axis)

In PCA, fabricated circuit 160 under analysis can be plotted along selected X and Y axes relative to attributes of fabricated circuit(s) 160 to yield a predictive quantity representing the likelihood that the identified features in fabricated circuit 160 include printed SRAFs 166. PCA can also be varied by assigning different statistical weights to different components $P_1$, $P_2$ of fabricated circuits 160, e.g., to alternatively emphasize different attributes such as thickness, separation distance, etc., between each identified feature in the image(s). In any event, the prediction of whether fabricated circuit 160 includes printed SRAFs 166 can depend upon whether one or more threshold values are exceeded by attributes of fabricated circuits 160 represented by PCA. According to an example, predictive algorithm 240 would predict fabricated circuit 160 as likely lacking printed SRAFs 166 when one or more characteristics have the same or similar score as a threshold value for fabricated circuit(s) 160 without printed SRAFs 166 therein. Conversely, predictive algorithm 240 would predict fabricated circuit 160 as likely including printed SRAFs 166 when features of the analyzed image have the same or similar score as fabricated circuit(s) 160 or threshold values for circuits which also include printed SRAFs 166.

In situations where IC modeling program 206 adjusts predictive algorithm 240 using PCA analysis, such adjustment can include changing the threshold values used in a comparison and/or the quantities being compared to quantify similarity between fabricated circuit 160 and other fabricated circuits 160 in training data repository 170 (i.e., the quantities used to plot X and Y axes). In still other embodiments, predictive algorithm 240 can implement multiple PCAs for multiple quantities and/or sets of compared variables, and predict whether fabricated circuit 160 includes printed SRAFs 166 based on whether more predictions yield a lack of printed SRAFs 166 or an appearance of printed SRAFs 166.

According to an illustrative example, PCA can be used to collapse an image of fabricated circuit 160 of predetermined size into a large number of dimensions. In one implementation, an image of fabricated circuit 160 measuring 750 pixels by 750 pixels can be collapsed into twenty principal dimensions by standardizing each image in a group of image to the same pixel area, and using each individual pixel as a dimension for image analysis. Thus, PCA can aid a user in implementing further predictive analyses on images of fabricated circuits 160 by compressing a large data set into a reduced number of features and metrics while approximating the same characteristics of the full image. In such cases, substantially the same amount of variance in the original image can be retained in the collapsed data with a reduced number of dimensions. Multiple types of PCA can be used to analyze fabricated circuit(s) 160, e.g., randomized PCA and/or other forms of PCA.

Second Example: Prediction Using K-Nearest Neighbor Analysis

Figure 5:
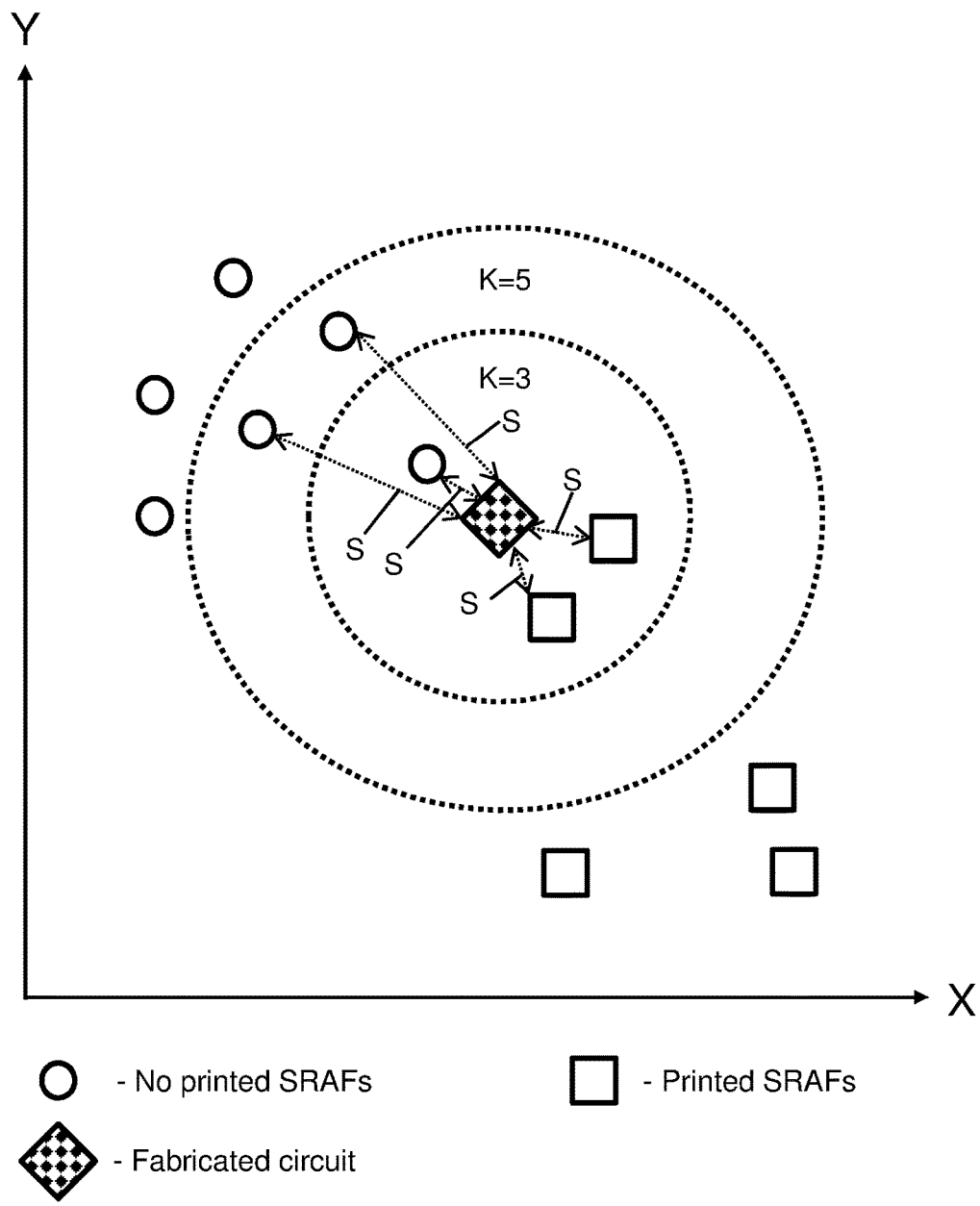
FIG. 5 depicts a predictive K-nearest neighbor analysis for a fabricated circuit according to embodiments of the disclosure.

Referring to FIGS. 2-3 and 5 together, predictive algorithm 240 can implement a K-nearest neighbor analysis to predict whether fabricated circuit 160 includes printed SRAFs 166. To implement a K-nearest analysis on fabricated circuit 160, various features of fabricated circuit 160 can be depicted in two or more dimensions on associated axes, e.g., X axis and Y axis. In the example of FIG. 4, total pixel surface area of each identified feature in an image of fabricated circuit 160 may be plotted on X axis while average separation distance between identified features of fabricated circuit 160 can be plotted on Y axis. Such features may include, e.g., a measure of pixel surface area of features in fabricated circuit 160 (e.g., greatest surface area, smallest surface area, average surface area, mode surface area, etc.), or similar measure for other properties of fabricated circuit 160 (e.g., other representative values for length dimension, width, separation distance between features, pixel density, etc.). Whichever feature or features are selected, each representative quantity for a given fabricated circuit 160 may be plotted on one axis, e.g., X axis, Y axis, etc., while others may be plotted on other respective axes. The variables plotted on each axis may be defined, e.g., using principal component analysis as discussed elsewhere herein. In the example shown in FIG. 5, fabricated circuit 160 under analysis is shown with a diamond-shaped point. Other fabricated circuits 160 without printed SRAFs 166 therein are depicted with circular points. Conversely, fabricated circuits 160 with printed SRAFs 166 therein are depicted with rectangular points.

In this representation, fabricated circuit 160 under analysis can have a corresponding separation distance S from each neighbor point (calculated, e.g., by a geometrical distance equation in 2D space). Predictive algorithm 240 may then select a predetermined number of neighbors, "K," for comparison with fabricated circuit 160. In an example where three neighbors are selected for comparison, fabricated circuit 160 is grouped together with three layouts having the lowest separation S distance away. In this case, a K-nearest neighbor analysis with three neighbors would predict fabricated circuit 160 as including printed SRAFs 166, e.g., because more of the three neighbors in the group include SRAFs 166 (i.e., are rectangular points). A K-nearest neighbor analysis with five neighbors, by comparison, would predict fabricated circuit 160 as lacking printed SRAFs 166, e.g., because more neighbors in the group do not exhibit printed SRAFs 166 therein (i.e., are circular points). Thus, prediction by K-nearest neighbor analysis includes the similarity between fabricated circuit 160 and comparable circuits, in addition to a predetermined number of compared neighbors, to yield a prediction. In situations where IC modeling program 206 adjusts predictive algorithm 240, such adjustment can include changing the number of neighbors being compared, and/or the quantities being compared to measure distance between fabricated circuit 160 and other circuits in training data repository 170. In still other embodiments, predictive algorithm 240 can implement multiple K-nearest neighbor analyses for multiple quantities and/or sets of compared variables, and predict whether fabricated circuit 160 includes printed SRAFs 166 based on whether more predictions yield a lack of printed SRAFs 166 or an appearance of printed SRAFs 166.

According to a further example, the distance between fabricated circuit 160 and other circuits can be calculated pursuant to the Minkowski distance formula used in comparable forms of analysis, e.g., to generalize Euclidean distance, Manhattan distance, and/or other measures of distance. A predetermined number of nearest neighbors (e.g., five nearest neighbors) can be used to make predictions using the entirety of data in training data repository 170. For each successive fabricated circuit 160, applying K-nearest neighbor analysis can include searching through all of training data repository for a predetermined number of most similar instances to produce an output variable, e.g., a class with the highest frequency from the predetermined number of most similar fabricated circuits. A K-nearest neighbor anaylsis may be preferable for a relatively smaller number of dimensions (e.g., between two and up to twenty or more dimensions).

Third Example: Prediction Using Support Vector Machine Analysis

Figure 6:
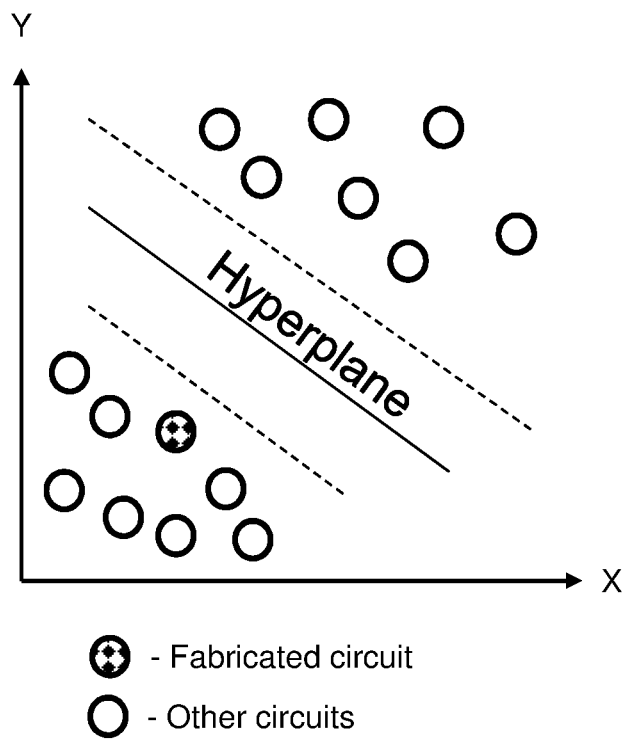
FIG. 6 depicts a predictive support vector machine analysis for a fabricated circuit according to embodiments of the disclosure.

Referring to FIGS. 2-3 and 6 together, predictive algorithm 240 can implement a support vector machine ("SVM") analysis to predict whether images of fabricated circuit(s) 160 include printed SRAFs 166. SVM analysis generally refers to a machine learning technique in which sets of data can be repeatedly organized into two sets divided by a separation boundary known as a "hyperplane." As additional data is added to the SVM set, the hyperplane can be updated to a new positioned to more accurately characterize further data added to a sample. Ideally, adding new data to an SVM set will continue to increase the size of the hyperplane dividing some set from another. SVM analysis can be performed with an initial set of training data, e.g., to ensure relevancy of each successively added data point. To implement an SVM analysis on fabricated circuits 160, various features of each fabricated circuit 160 can be depicted in two or more dimensions on associated axes, e.g., X axis and Y axis, similar to the K-nearest neighbor analysis described herein. Such features may include, e.g., a measure of surface area of pixels and/or features in an image of fabricated circuit 160 (e.g., greatest surface area, smallest surface area, average surface area, mode surface area, etc.), or similar measure for other properties of fabricated circuit 160 (e.g., other representative values for length dimension, width, separation distance between features, pixel density of identified features, etc.). Whichever feature or features are selected, each representative quantity for a given fabricated circuit 160 may be plotted on one axis, e.g., X axis, Y axis, etc., while others may be plotted on other respective axes. In the example of FIG. 6, total surface area of each identified feature in fabricated circuit 160 may be plotted on X axis while average separation distance between features in fabricated circuit 160 may be plotted on Y axis. The variables plotted on each axis may be defined, e.g., using principal component analysis as discussed elsewhere herein. In the example shown in FIG. 6, fabricated circuit 160 under analysis is shown with circular point with texturing. Other fabricated circuits 160 which have been predetermined to lack or include printed SRAFs 166 are depicted with non-textured circular points. Fabricated circuits 160 which include printed SRAFs 166 are shown on the upper side of the hyperplane for the set under analysis, while other fabricated circuits 160 which lack SRAFs 166 when fabricated are shown on the lower side of the same hyperplane.

In this representation, proposed IC layout 100 under analysis be positioned most closely with fabricated circuits 160 known to lack printed SRAFs 166. Here, a hyperplane is defined between each set of points such that fabricated circuit 160 is grouped together with other fabricated circuits 160 which lack printed SRAFs 166 therein. In the set of data illustrated in FIG. 6, the non-textured points may be included in training data repository 170 and may correspond to a knowledge base with several fabricated circuits 160 used for comparison. However, it is understood that the set of data and corresponding hyperplane may be much smaller where training data repository 170 includes fewer fabricated circuits 160 for comparison. In the example of FIG. 6, predictive algorithm 240 would predict fabricated circuit 160 (e.g., the shaded point) as lacking printed SRAFs 166 based on image data thereof. Thus, prediction by SVM analysis includes may be based on determining whether fabricated circuit 160 is positioned on one side of the hyperplane or another. In situations where IC modeling program 206 adjusts predictive algorithm 240 using SVM analysis, such adjustment can include changing the reference data being plotted, the size of the hyperplane, and/or the quantities being compared to quantify similarity between fabricated circuit 160 and other fabricated circuits 160 included in training data repository 170 (i.e., the quantities used to plot X and Y axes). In still other embodiments, predictive algorithm 240 can implement multiple SVM analyses for multiple quantities and/or sets of compared variables, and predict whether fabricated circuit 160 includes printed SRAFs 166 based on whether more predictions yield a lack of printed SRAFs 166 or an appearance of printed SRAFs 166. Relative to K-nearest neighbor analysis, SVM analysis may be more complex during implementation due to some hyperplanes having a relatively small size when some image attributes of each fabricated circuit 160 (e.g., attributes with minor or ambiguous differences) are being compared.

Alternative Embodiments and Implementations

As will be appreciated by one skilled in the art, the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module," or "system." Furthermore, aspects of the present invention may take the form of a computer program product embodied in one or more computer readable medium(s) having computer readable program code embodied thereon.

Any combination of one or more computer readable medium(s) may be used. A computer readable storage medium may be, for example, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As used herein, the term "configured," "configured to" and/or "configured for" can refer to specific-purpose features of the component so described. For example, a system or device configured to perform a function can include a computer system or computing device programmed or otherwise modified to perform that specific function. In other cases, program code stored on a computer-readable medium (e.g., storage medium), can be configured to cause at least one computing device to perform functions when that program code is executed on that computing device. In these cases, the arrangement of the program code triggers specific functions in the computing device upon execution. In other examples, a device configured to interact with and/or act upon other components can be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component can aid in performing a function, for example, displacement of one or more of the device or other component, engagement of one or more of the device or other component, etc.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application technical improvement over technologies found in the marketplace, or to enable others of ordinary skill in the art to understand the embodiments disclosed herein.

What is claimed is:

1. A method for creating a knowledge base for optical proximity correction (OPC), the method comprising:
    fabricating a circuit using a proposed IC layout;
    identifying a plurality of features in an image of the fabricated circuit;
    predicting, based on the identifying and a predictive algorithm, whether the fabricated circuit includes a printed sub-resolution assist feature (SRAF) from the proposed IC layout;
    determining the predicting as being correct when the fabricated circuit includes the printed SRAF, or as being incorrect when the fabricated circuit does not include the printed SRAF;
    in response to the predicting being incorrect:
        adjusting the predictive algorithm, and
        flagging the fabricated circuit as incorrectly predicted;
    in response to the predicting being correct, flagging the fabricated circuit as correctly predicted; and
    storing the image of the fabricated circuit in a repository of training data.

2. The method of claim 1, wherein the repository of training data includes images of fabricated circuits for different products.

3. The method of claim 1, wherein the predicting is further based on the repository of training data.

4. The method of claim 3, wherein the repository of training data includes a plurality of sample circuit images, the plurality of sample circuit images including at least one SRAF-free image and at least one SRAF-including image.

5. The computer-implemented method of claim 1, wherein the predictive algorithm includes a principal component analysis of the fabricated circuit.

6. The computer-implemented method of claim 1, wherein the predictive algorithm includes a support vector machine (SVM) analysis of the fabricated circuit.

7. The computer-implemented method of claim 1, wherein the predictive algorithm includes a K-nearest neighbor analysis of the fabricated circuit.

8. A program product stored on a computer readable storage medium, the program product operative to create a knowledge base for optical proximity correction (OPC) when executed, the computer readable storage medium comprising program code for:
    causing a fabricating device to fabricate a circuit using a proposed IC layout;
    identifying a plurality of features in an image of the fabricated circuit;
    predicting, based on the identifying and a predictive algorithm, whether the fabricated circuit includes a printed sub-resolution assist feature (SRAF) from the proposed IC layout;
    determining the predicting as being correct when the fabricated circuit includes the printed SRAF, or as being incorrect when the fabricated circuit does not include the printed SRAF;
    in response to the predicting being incorrect:
        adjusting the predictive algorithm, and
        flagging the printed circuit as incorrectly predicted;
    in response to the predicting being correct, flagging the fabricated circuit as correctly predicted; and
    storing the image of the fabricated circuit in a repository of training data.

9. The program product of claim 8, wherein the repository of training data includes images of fabricated circuits for different products.

10. The program product of claim 8, wherein the program code for predicting is further based on the repository of training data.

11. The program product of claim 10, wherein the repository of training data includes a plurality of sample circuit images, the plurality of sample circuit images including at least one SRAF-free image and at least one SRAF-including image.

12. The program product of claim 8, wherein the predictive algorithm includes a principal component analysis of the fabricated circuit.

13. The program product of claim 12, wherein the predictive algorithm includes a support vector machine (SVM) analysis of the fabricated circuit.

14. The program product of claim 12, wherein the predictive algorithm includes a K-nearest neighbor analysis of the fabricated circuit.

15. A system for building a knowledge base for optical proximity correction (OPC), the system comprising:
    a fabricating device configured to fabricate a circuit using a proposed integrated circuit (IC) layout; and
    a layout analysis component configured to:
        identify a plurality of features in an image of a fabricated circuit yielded from the fabricating device; and
        predict, based on the identifying and a predictive algorithm, whether the fabricated circuit includes a printed sub-resolution assist feature (SRAF);
    a training component configured to:
        determine the prediction as being correct when the fabricated circuit includes the printed SRAF, or as being incorrect when the fabricated circuit does not include the printed SRAF;
        in response to the prediction being incorrect:
            adjust the predictive algorithm, and
            flag the fabricated circuit as incorrectly predicted,
        in response to the prediction being correct, flag the fabricated circuit as correctly predicted, and
        store the image of the fabricated circuit in a repository of training data.

16. The system of claim 15, wherein the repository of training data includes images of fabricated circuits for different products.

17. The system of claim 15, wherein the layout analysis component is further configured to predict whether the image of the fabricated circuit will include the printed SRAF based on the repository of training data.

18. The system of claim 15, wherein the predictive algorithm includes a principal component analysis of the fabricated circuit.

19. The system of claim 15, wherein the predictive algorithm includes a support vector machine (SVM) analysis of the fabricated circuit.

20. The system of claim 15, wherein the predictive algorithm includes a K-nearest neighbor analysis of the fabricated circuit.

\* \* \* \* \*